United States Patent [19]

Baker et al.

[11] Patent Number: 5,187,811

[45] Date of Patent: Feb. 16, 1993

[54] ERROR DETECTION

[75] Inventors: James C. Baker, Hanover Park; Stephen N. Levine, Itasca; Larry C. Puhl, Sleepy Hollow; Scott N. Carney, Hoffman Estates, all of Ill.

[73] Assignee: Motorola, Inc., Schaumburg, Ill.

[21] Appl. No.: 896,913

[22] Filed: Jun. 11, 1992

Related U.S. Application Data

[63] Continuation of Ser. No. 737,802, Jul. 29, 1991, abandoned, which is a continuation of Ser. No. 442,887, Nov. 29, 1989, abandoned.

[51] Int. Cl.$^5$ .................. H04Q 9/02; H04B 1/10; G06F 11/08
[52] U.S. Cl. ................... 455/35.1; 455/54.1; 455/218; 379/63; 371/5.1; 371/5.5
[58] Field of Search ........ 379/58, 59, 60, 63; 371/5.1, 5.4, 5.5; 455/33.1, 34.1, 34.2, 54.1, 35.1, 38.2, 63, 67.3, 89, 218, 222, 296, 226.1

[56] References Cited

U.S. PATENT DOCUMENTS

| | | | |
|---|---|---|---|
| 3,309,463 | 3/1967 | Roedl | 375/114 |
| 4,404,675 | 9/1983 | Kerchevsky | 371/5.4 |
| 4,450,573 | 5/1984 | Noble | 455/218 |
| 4,541,091 | 9/1985 | Nishida et al. | 371/5.1 |
| 4,649,543 | 3/1987 | Levine | 371/5.1 |
| 4,829,519 | 5/1989 | Scolton et al. | 371/5.5 |
| 4,839,907 | 6/1989 | Saneski | 375/113 |
| 4,858,235 | 8/1989 | Matsuda et al. | 371/5.4 |
| 4,864,573 | 9/1989 | Horsten | 371/5.1 |
| 4,920,537 | 4/1990 | Darling et al. | 371/5.1 |
| 5,146,610 | 9/1992 | Longshore | 455/35.1 |

Primary Examiner—Reinhard J. Eisenzopf
Assistant Examiner—Lisa Charouel
Attorney, Agent, or Firm—Raymond J. Warren; F. John Motsinger; Raymond A. Jenski

[57] ABSTRACT

There is provided a mechanism for error detection comprising: detecting the symmetry of error distributions over adjacent time intervals and muting of a radiotelephone in response to detected loss of substantial symmetry, unless errors are attributable to valid alternative detections. It is further characterized by: detecting the symmetry of error distributions over adjacent time intervals and muting a radiotelephone as a corrective response to detected consequential asymmetry or loss of substantial symmetry (unless errors are attributable to alternative detections of valid synchronization words) and cancelling any such corrective response upon subsequent alternative detections of valid synchronization words.

14 Claims, 2 Drawing Sheets

ERROR DETECTION

This is a continuation of application Ser. No. 07/737,802, filed Jul. 29, 1991 and now abandoned, which is a continuation of application Ser. No. 07/442,887, filed Nov. 29, 1989 and now abandoned.

THE FIELD OF INVENTION

This invention is concerned with error detection.

More particularly, this invention is concerned with muting a radiotelephone on asymmetry in detected errors.

BACKGROUND OF THE INVENTION

Analog cellular radiotelephone systems utilize sub-audible signalling alongside the speech for supervision of the network. Thus, while any given radiotelephone user is speaking, sub-audible data messages are exchanged between his radiotelephone and the network to prepare for handoffs from cell-to-cell, for power level changes, and the like. This sub-audible signalling is also utilized to maintain continuity of the radio link between the cell site and the radiotelephone. Previous analog cellular radiotelephone systems utilized a pseudo-continuously transponded Supervisory Audio Tone (SAT), a unique sub-audible tone assigned to each cell, to differentiate the intended cell from surrounding ones and to maintain continuity of the radio link between the cell and the radiotelephone; loss of this transponded and returned tone would cause both the radiotelephone and the network to mute their audio to prevent noise from being heard by either listener. In split-channel analog cellular, these SAT tones interfered with one another and were replaced by digital SAT (DSAT)—see Levine U.S. Pat. No. 4,984,290 U.S. Ser. No. 228,071, filed Aug. 4, 1988, incorporated herein by reference thereto.

The problem is that a properly selected DSAT (with minimum hamming distance and not susceptible to falsing, according to the incorporated disclosure) is shorter than many data messages. Accordingly, interleaved, sub-audible data messages required for network supervision would first be detected as a loss of DSAT and would mistakenly cause voice muting. The challenge then is to have data messages not false the voice muting process.

This invention takes as its object to overcome these shortcomings and to realize certain advantages presented below.

SUMMARY OF THE INVENTION

The solution provided by the instant invention is to provide distributed DSAT loss detection and muting determination based upon the asymmetry of errors in the distribution.

Thus, there is provided a mechanism for error detection comprising: detecting the symmetry of error distributions over adjacent time intervals and muting of a radiotelephone in response to detected loss of substantial symmetry, unless errors are attributable to valid alternative detections. It is further characterized by: detecting the symmetry of error distributions over adjacent time intervals and muting a radiotelephone as a corrective response to detected consequential asymmetry or loss of substantial symmetry (unless errors are attributable to alternative detections of valid synchronization words) and cancelling any such corrective response upon subsequent alternative detections of valid synchronization words.

DESCRIPTION OF THE DRAWINGS

Additional objects, features and advantages of the invention will be more clearly understood and the best mode contemplated for practicing it in its preferred embodiment will be appreciated (by way of unrestricted example) from the following detailed description, taken together with the accompanying drawings in which.

DETAILED DESCRIPTION

Figure 1:
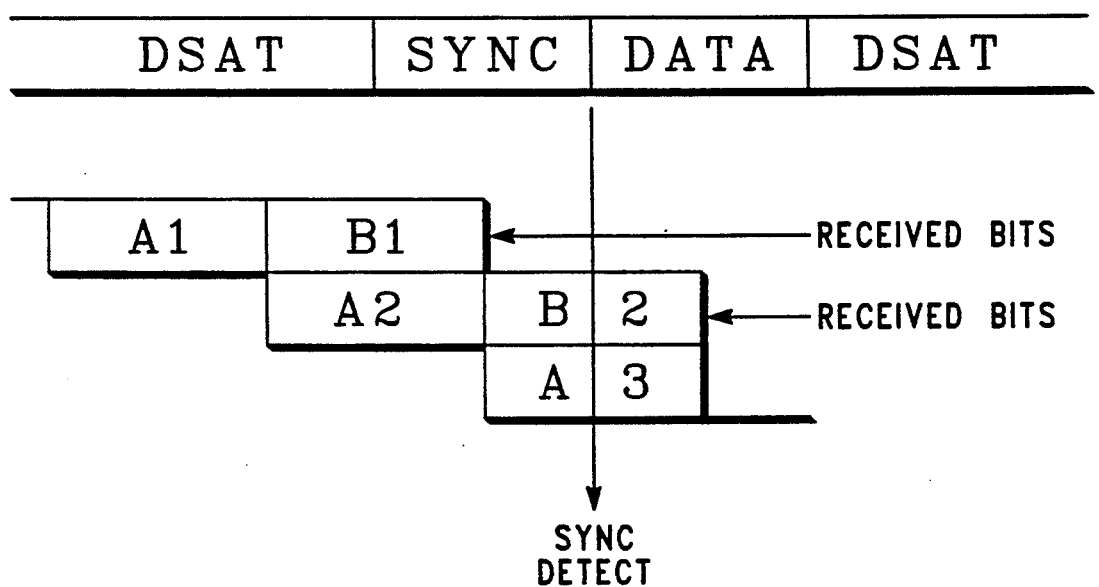
FIG. 1 is an event diagram of the network in which the preferred embodiment of the invention operates.

FIG. 1 is an event diagram of the network in which the preferred embodiment of the invention operates.

FIG. 1 illustrates the sub-audible transmissions of a voice link between a cell in a cellular network and a radiotelephone and their contemporaneous (yet asynchronous) detection in consecutive intervals A and B; B contains the latest 30 bits and A contains the previous 30 bits.

During each interval A/B of 150 ms (30 bits at 200 BPS), the errors between the bits actually received and circular shifts of the expected DSAT pattern are counted. However, when the error count of the present interval (B) increases unacceptably, either the loss of DSAT is being detected (necessitating voice muting) or the arrival of DATA has begun (preceded by a synchronization word—SYNC), not necessitating muting the voice path.

Errors exceeding an acceptability threshold in two consecutive intervals (A/B) are required to cause muting of the voice path. Ordinarily, the receipt of something other than DSAT during intervals B1/A2 (same 150 ms interval) and B2/A3 (same 150 ms interval) would cause the voice path to be muted. However, detection of DSAT during A1 prevents muting during B1 (two consecutive error thresholds must be exceeded) while the asymmetrical distribution of unacceptable errors from A1 to B1/A2 causes the SYNC pattern to be treated as a potentially falsing signal and the distribution of unacceptable errors from DATA would cause muting during interval B2/A3, except that the detection of SYNC—an alternatively valid detection criterion—sometime during that same interval (B2/A3) keeps the voice path open throughout; no continuity of speech is lost.

It is this sustained asymmetrical distribution of unacceptable errors that accounts for the improvement in mute sensitivity and lowering the falsing rate. Had the interval been one 300 ms (or other length) window, a sync word entering the window would cause many errors, thus generating a mute unless an unreasonably high threshold was chosen.

Only from the symmetrical distribution of unacceptable errors in two consecutive intervals (and the absence of a valid SYNC detection) could the loss of link integrity be concluded and could one reliably mute the voice path, without falsing.

The mechanics for implementing this invention are presented below:

DSAT ACQUISITION

DSAT is acquired whenever the mobile switches to a voice channel (for example, to make a call or after a handoff), or after the radio has been muted for 4.5 seconds. DSAT is transmitted at 200 BPS to provide a maximum number of uncorrelated samples for better noise falsing performance, and to provide the greatest distance properties between DSAT sequences over the shortest time interval. There is a minimum distance between all cyclic shifts of a DSAT sequence. This allows the DSAT data stream to be analyzed beginning at any bit, not just at DSAT "word" boundaries. This allows the DSAT acquisition algorithm to continuously check for DSAT, allowing for faster acquisition and greater sensitivity due to increased number of valid DSAT phases. The tradeoff is an increase in DSAT falsing.

The Multiple Phase DSAT Acquisition Algorithm (MPDAA) (used by the mobile and base site) is as follows:

The received bits from the PLL (200 BPS) are entered into a 24-bit register. The 24-bit DSAT sequence assigned to the current cell is compared to the received bits, and if there are 1 or no errors, then an Initial DSAT Detect has occurred. For later reference, this is the first 24 bits of the B window register. If more than 1 error has occurred, then the DSAT sequence is rotated and again compared to the received 24-bit register. This is repeated until either an initial detect occurs or all 24 cyclic rotations of the DSAT sequence have been compared. If the latter case is true, then the next received bit is shifted into the 24-bit receive register. If an initial detect has occurred, then the current DSAT phase has been determined, and the acquisition routine starts comparing only the expected DSAT phase. This reduces both the DSAT falsing probability and the processing load.

With a threshold of 1 error, the probability of falsing on random noise is 3.576 E-5 per bit received. This results in one false per 139.8 seconds of received random noise. The mobile expects DSAT to be present when it arrives on a voice channel. By delaying its DSAT acquisition to account for synthesizer settling and PLL locking, the amount of noise that can cause a DSAT false is greatly minimized. However, there is a possibility of the mobile arriving on channel during a slow fade. Noise is also present at the base. In order to improve the falsing protection at both the base and mobile, the next 6 bits of DSAT after the Initial DSAT Detect are shifted into the B register and then compared to the expected DSAT bits, utilizing the determined DSAT phase. If all 6 bits of this DSAT Qualifying Check are correct, then a Confirmed DSAT Detect has occurred. The falsing probability of a confirmed DSAT detect is 5.5875 E-7 per received bit, or 1 false per 2.49 hours. If an error occurs in the 6 qualifying bits, then the next bit is shifted into the B receive window register, and the DSAT acquisition starts over with the Multiple Phase DSAT Acquisition Algorithm looking for an Initial DSAT Detect.

MUTE ALGORITHM

Figure 2:
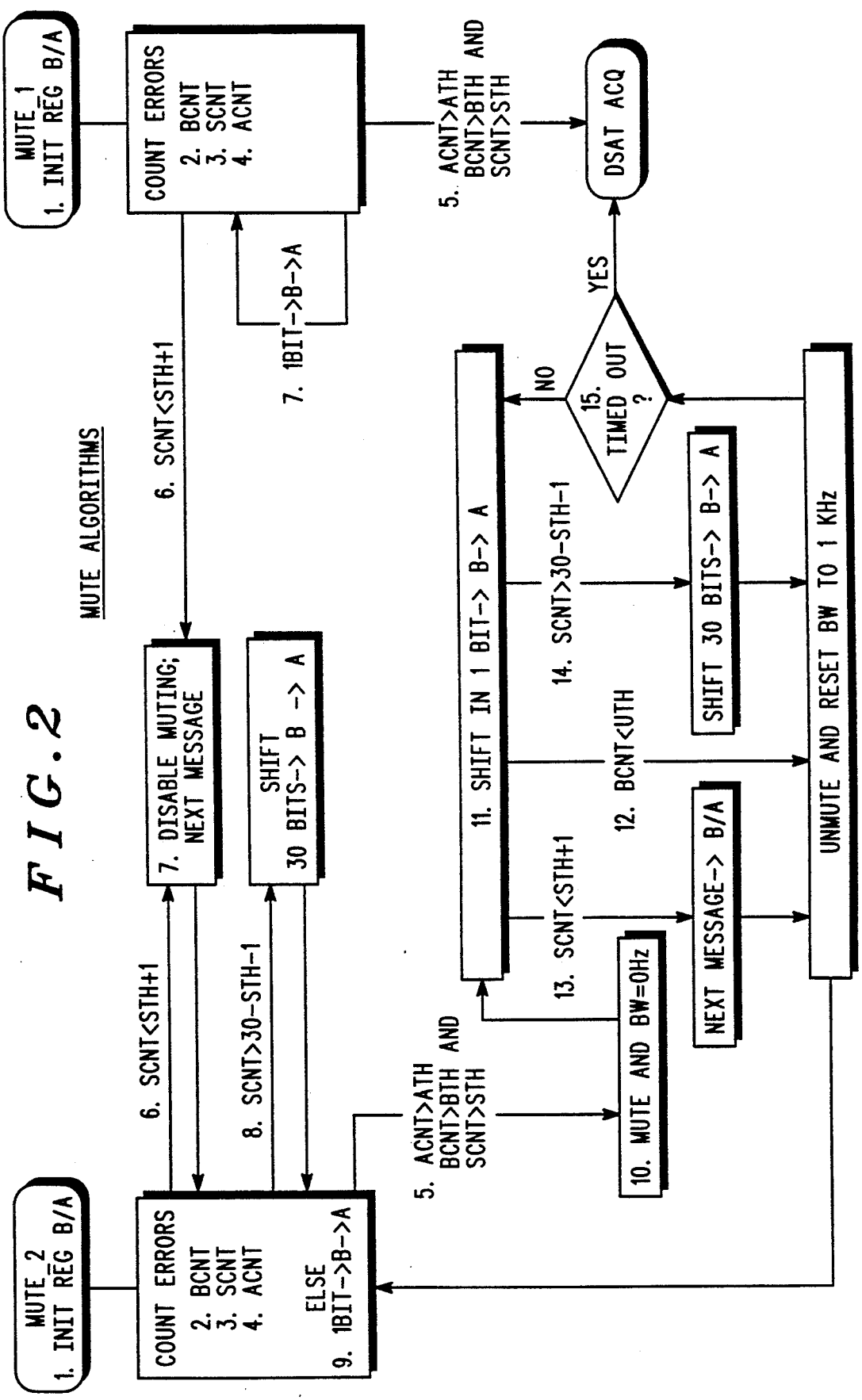
FIG. 2 is a state diagram of a method according to the preferred embodiment of the invention.

FIG. 2 is a state diagram of a method according to the preferred embodiment of the invention.

The following is a description of two mute algorithms (MUTE_1 and MUTE_2) utilizing sub-audible signaling on a cellular voice channel. In order to prevent long noise bursts from being heard by the cellular radiotelephone landline or mobile user, the audio is muted when the received signal is interrupted due to interference or noise. The following mute algorithms utilize the continuous reception of a DSAT sequence as a continuous bit stream rather than as word sequences. A mute algorithm is started only after a Confirmed DSAT Detect. Since the DSAT phase is known, from this point on, only the expected DSAT phase is checked. The process of checking for only the single expected DSAT phase is performed by the Single Phase DSAT Detection Algorithm.

Mute algorithm MUTE_2 is used during conversation mode, whereas MUTE_1 is used briefly only after a Confirmed DSAT Detect. An example of the exact usage times of these algorithms is explained in a later section on the ALERT protocol.

All references to DSAT in the MUTE_2 ALGORITHM should also apply to inverted DSAT when this algorithm is applied at the base site.

MUTE THEORY OF OPERATION

The use of two 30-bit windows with independent thresholds keeps the mute algorithm from falsing on a data message. Since the data message Sync Word has a minimum distance of 10 bits from all phases of all DSAT sequences, the initial reception of a Sync Word would be perceived as many errors in the DSAT stream. Up to the point in which a Sync Word detect occurs, parts (b) and (c) in step 5 of MUTE_2 are satisfied, but part (a) is not satisfied, keeping the Sync Word from muting the audio. After the Sync Word has entered register B, step (c) will keep the audio from being muted. At this point, further mutes are suspended until the Sync Word and data message have been flushed from the mute A and B receive windows. During fades or an incorrect DSAT interference, the error distribution will be more even than the Sync Word, and parts (a), (b) and (c) will be satisfied to mute the audio.

MUTE_2 ALGORITHM

1. The received bit stream enters two registers (or windows), A and B, each 150 ms or 30 DSAT bits long. The received bits enter register B, exiting register A.

2. The 30 received bits in register B are compared to the expected DSAT stream, and the number of DSAT errors are counted (Bcnt).

3. The B register (which can be the holding register for the sync correlator) is compared to the data message 30-bit Sync Word (195A99A6), and the number of errors are counted (Scnt).

4. The 30 received bits in register A are compared to the expected DSAT stream, and the number of DSAT errors are counted (Acnt).

5. If
   (a) (Acnt>Ath) and
   (b) (Bcnt>Bth) and
   (c) (Scnt>Sth) (i.e. there was not a sync detect during B window)
   then go to step 10.

6. If a Sync Word detect occurs in the B window (Scnt<Sth+1)
   then go to step 7
   else go to step 8.

7. Shift in 110 bits for a FVC message or 126 bits for a RVC message. (Muting is disabled for the duration of a channel message plus 30 bits to fill B register.) Go to step 2.

8. If (Scnt>(30-Sth-1) i.e. an inverted Sync Word detect
   then shift in 30 bits for flushing out B register and go to step 2.

9. The received DSAT stream is shifted one bit through the A and B registers, and the algorithm returns to step 2.

10. Mute the receive audio and set the PLL bandwidth to zero (free running the PLL). This guarantees that a bit slip can not occur for the duration of the mute.

11. The received DSAT stream is shifted one bit through the A and B registers.

12. The DSAT errors in the 30 Bit B window are counted, and if (Bcnt<Uth)

then the received audio is unmuted, the PLL bandwidth is set to 1 Hz, and the algorithm returns to step 2.

13. The Sync Word errors in window B are counted, and if (Scnt<Sth+1)

then the received audio is unmuted and the PLL bandwidth is set to 1 Hz, and either 110 bits for a FVC or 126 bits for a RVC message are shifted in. Go to step 2.

14. If (Scnt>(30-Sth-1) i.e. an inverted Sync Word detect, then the received audio is unmuted and the PLL bandwidth is set to 1 Hz, 30 bits are shifted in, and the algorithm returns to step 2.

15. The algorithm is returned to step 11 through 14 until a 4.5-second time-out is reached, after which execution leaves this MUTE_2 ALGORITHM and returns to the Multiple Phase DSAT Acquisition Algorithm. Returning to the Multiple Phase DSAT Acquisition Algorithm provides a final attempt to secure DSAT synchronization before the call is dropped.

Suggested Parameters
Sth=4
Ath=Bth=3
Uth=2

All references to DSAT in the MUTE_1 ALGORITHM should also apply to inverted DSAT when this algorithm is applied at the base site.

MUTE_1 ALGORITHM

1. The received bit stream enters two registers (or windows), A and B, each 150 ms or 30 DSAT bits long. The received bits enter register B, exiting register A.

2. The 30 received bits in register B are compared to the expected DSAT stream, and the number of DSAT errors are counted (Bcnt).

3. The B register (which can be the holding register for the sync correlator) is compared to the data message 30-bit Sync Word (195A99A6) and the number of errors are counted (Scnt).

4. The 30 received bits in register A are compared to the expected DSAT stream, and the number of DSAT errors are counted (Acnt).

5. If
   (a) (Acnt>Ath) and
   (b) (Bcnt>Bth) and
   (c) (Scnt>Sth) (i.e. there was not a sync detect during B window)
then leave MUTE_1 ALGORITHM and return to Multiple Phase DSAT Acquisition Algorithm.

6. If a Sync Word detect occurs in the B window (Scnt<Sth+1)
   then go to MUTE_2 ALGORITHM—Step 7.

7. The received DSAT stream is shifted one bit through the A and B registers, and the algorithm returns to step 2.

ALERT

As an example of how the mute algorithms are used, the ALERT protocol is listed below.

After the mobile receives a valid PAGE message and is assigned to a voice channel, the following sequence of events defines the ALERT PROTOCOL.

1. Base site transmits DSAT.

2. Mobile tunes to voice channel, sets PLL to 10 Hz, waits until 24 bits have been received, and starts Multiple Phase DSAT Acquisition Algorithm.

3. Mobile has Initial and Confirmed DSAT Detects. PLL bandwidth is reduced to 1 Hz. The PLL bandwidth is never returned to 10 Hz during activity on this channel.

4. Mobile transponds DSAT to the base site, starts checking for FVC messages, and starts MUTE_1 algorithm which uses the Single Phase DSAT Detect Algorithm. MUTE_1 keeps the PLL operating at 1 Hz bandwidth, and if a mute occurs (possibly due to an improper DSAT phase), it returns to the Multiple Phase DSAT Acquisition Algorithm much faster than MUTE_2.

5. After starting MUTE_1, the mobile starts counting DSAT bits. After receiving 30 DSAT bits (correct or not) without a mute, then the mobile switches to MUTE_2 algorithm. If a mute occurs during MUTE_1, then the mobile is returned to the Multiple Phase DSAT Acquisition Algorithm. The 30-bit count provides further confirmation to the correct DSAT phase, and allows MUTE_2 to begin. The advantage of the MUTE_2 algorithm is that once Initial DSAT Detect, Confirmed DSAT Detect, and MUTE_1 are satisfied, no bit slips can occur; hence, the Multiple Phase DSAT Acquisition Algorithm is not required. This improves DSAT falsing protection and reduces processor loading.

The use of the mute algorithms before the call is put through, of course, does not provide the user with any audio noise protection because the audio is already muted at this time. However, these algorithms provide a useful purpose of monitoring the channel to return to Multiple Phase DSAT Acquisition Algorithm, or (after MUTE_2 starts) to have the PLL free run during noise to protect against bit slips.

(If the Confirm DSAT Detection falsing protection of 2.49 hours is considered sufficient, then the use of MUTE_1 can be dropped, and the MUTE_2 Algorithm can start right after the Confirmed DSAT Detect.)

6. After the base site has Initial and Confirmed DSAT Detects, it starts continuously transmitting FVC ALERT messages. The PLL is reduced to 1 Hz bandwidth. The PLL bandwidth is never returned to 10 Hz during activity on this channel. The base starts the MUTE_1 algorithm, which uses the Single Phase DSAT Detect Algorithm. The base also starts checking for inverted DSAT from the mobile. (The base continues to detect non-inverted DSAT until the inverted DSAT arrives.)

No ARQ ACK or NAK is required from the mobile before repeating the ALERT message. No interleaving DSAT between ALERT messages is required.

MUTE_1 keeps the PLL operating at 1 Hz, and if a mute occurs (possibly due to an improper DSAT phase), it returns to the Multiple Phase DSAT Acquisition Algorithm much faster than MUTE_2.

7. After starting MUTE_1, the base starts counting DSAT bits. After receiving 30 DSAT bits (correct or not) without a mute, then the base switches to MUTE_2 algorithm. If a mute occurs during MUTE_1, then the base is returned to the Multiple Phase DSAT Acquisition Algorithm. The 30-bit count provides further confirmation to the correct DSAT phase, and allows MUTE_2 to begin. The advantage of the MUTE_2 algorithm is that once Initial DSAT Detect, Confirmed DSAT Detect, and MUTE_1 are satisfied, no bit slips can occur; hence, the Multiple Phase DSAT Acquistion Algorithm is not required. This improves DSAT falsing protection and reduces processor loading.

8. After receiving a valid error detected FVC ALERT, the mobile starts transponding inverted DSAT to the base site indicating that the mobile has received the ALERT FVC message.

9. After the base site detects inverted DSAT (over a 30-bit interval with 0 or 1 errors), it stops transmitting the FVC ALERT message and transmits DSAT.

10. When the mobile detects DSAT (over a 30-bit interval with 0 or 1 errors), the mobile rings the mobile user.

11. When the mobile user goes off-hook, the mobile transponds non-inverted DSAT.

12. When the base site detects non-inverted DSAT (over a 30-bit interval with 0 or 1 errors), then the base site connects the call.

The attendant advantages of this invention include improvement in mute sensitivity and protection against falsing, individually adjustable thresholds for balancing mute sensitivity versus speech quality, and providing bit-slip protection during high noise conditions.

Thus, there has been provided a mechanism for error detection comprising: detecting the symmetry of error distributions over adjacent time intervals and muting of a radiotelephone in response to detected loss of substantial symmetry, unless errors are attributable to valid alternative detections. It is further characterized by: detecting the symmetry of error distributions over adjacent time intervals and muting a radiotelephone as a corrective response to detected consequential asymmetry or loss of substantial symmetry (unless errors are attributable to alternative detections of valid synchronization words) and cancelling any such corrective response upon subsequent alternative detections of valid synchronization words.

It will be appreciated by those ordinarily skilled in the art that the means for carrying out this invention are readily available and their operation well understood. While the preferred embodiment of the invention has been described and shown, it will be appreciated by those skilled in this field that other variations and modifications of this invention may be implemented. For example, for the purpose of varying mute sensitivity, the thresholds of the two windows need not be equivalent. It is also conceivable to vary the window lengths. This would trade off falsing protection versus mute sensitivity.

These and all other variations and adaptations are expected to fall within the ambit of the appended claims.

What we claim and desire to secure by Letters Patent is:

1. A method of error detection comprising:
   detecting a quantity of bit errors in a first and a second set of bits as compared to a valid bit pattern;
   and muting a radiotelephone in response to the detected quantity of bit errors in the first set and the second set of bits if the quantities exceed a first and a second predetermined threshold, respectively, unless one of the first and second set of bits has a quantity of errors less than a third threshold when compared to a valid alternative bit pattern.

2. The method of claim 1 wherein the first and second set of bits are received over adjacent time intervals.

3. The method of claim 1 further comprising the step of unmuting the radiotelephone upon receipt of a subsequent set of bits having a quantity of bit errors fewer than one of a first unmuting threshold when compared to the valid bit pattern and a second unmuting threshold when compared to the valid alternative bit pattern.

4. The method of claim 1 wherein the valid bit pattern is a digital supervisory audio tone (DSAT).

5. The method of claim 1 wherein the valid alternative bit pattern is a synchronization bit pattern.

6. A method of error detection comprising:
   detecting a quantity of bit errors in a first and a second set of bits as compared to a valid bit pattern;
   and muting a radiotelephone as a response to the detected quantity of bit errors in the first set and the second set of bits if the quantity exceeds a first and a second predetermined threshold, respectively, unless one of the first and second set of bits has a quantity of errors less than a third threshold when compared to a valid alternative bit pattern;
   and cancelling the muting response upon subsequent detections of a subsequent set of bits having a quantity of bit errors less than a fourth threshold when compared to the valid alternative bit pattern.

7. An apparatus for error detection comprising:
   means for detecting errors in a first and a second set of bits as compared to a valid bit pattern;
   and means for taking corrective action in response to the detected errors exceeding a predetermined first and second thresholds, respectively, unless one of said first and second sets of bits has a quantity of errors less than a third threshold when compared to a valid alternative bit pattern.

8. The apparatus of claim 7 wherein the means for taking corrective action comprises a means for muting a received signal.

9. The apparatus of claim 7 further comprising means for cancelling the corrective action upon receipt of a subsequent set of bits having fewer errors than one of a first cancelling threshold when compared to the valid bit pattern and a second cancelling threshold when compared to the valid alternative bit pattern.

10. The apparatus of claim 7 wherein the valid bit pattern is a digital supervisory audio tone (DSAT).

11. The apparatus of claim 7 wherein the valid alternative bit pattern is a synchronization word bit pattern.

12. A method of error detection comprising:
   comparing a first set of bits and a second set of bits to a supervisory bit pattern;
   detecting a quantity of bit errors in the first and second set of bits; and
   muting a radiotelephone if the quantity of bit errors in the first and second set of bits exceeds a first and a second predetermined threshold, respectively, unless one of the first and second set of bits has a quantity of bit errors less than a third threshold when compared with a synchronization word.

13. The method of claim 12 further comprising the step of unmuting the radiotelephone upon receipt of a subsequent set of bits having fewer errors than one of a first unmuting threshold when compared to the supervisory bit pattern and a second unmuting threshold when compared to the synchronization word.

14. The method of claim 12 wherein the supervisory bit pattern is a digital supervisory audio tone (DSAT).

* * * * *